(12) United States Patent
Maheshwari et al.

(10) Patent No.: US 8,269,533 B2
(45) Date of Patent: Sep. 18, 2012

(54) DIGITAL PHASE-LOCKED LOOP

(75) Inventors: Sanjeev Maheshwari, Fremont, CA (US); Emerson Fang, Fremont, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 73 days.

(21) Appl. No.: 12/875,337

(22) Filed: Sep. 3, 2010

(65) Prior Publication Data
US 2012/0056653 A1 Mar. 8, 2012

(51) Int. Cl.
*H03L 7/06* (2006.01)
(52) U.S. Cl. ............... 327/158; 327/156; 327/161
(58) Field of Classification Search .......... 327/156, 327/158, 161
See application file for complete search history.

(56) References Cited

U.S. PATENT DOCUMENTS
2008/0297216 A1* 12/2008 Chiang et al. ............... 327/158
* cited by examiner

*Primary Examiner* — John Poos
(74) *Attorney, Agent, or Firm* — Ingrassia Fisher & Lorenz, P.C.

(57) ABSTRACT

Apparatus, systems and methods are provided for digital phase-locked loops. A digital phase-locked loop comprises an oscillator module configured to generate an output signal and a phase detection module coupled to the oscillator module. The phase detection module is configured to signal the oscillator module to adjust a frequency of the output signal by a first amount when a phase difference between a reference signal and the output signal is less than a threshold amount, and signal the oscillator module to adjust the frequency by a greater amount when the phase difference is greater than the threshold amount.

20 Claims, 6 Drawing Sheets

DIGITAL PHASE-LOCKED LOOP

TECHNICAL FIELD

Embodiments of the subject matter described herein relate generally to electronic circuits, and more particularly, to digital phase-locked loops.

BACKGROUND

Phase-locked loops (PLLs) are commonly used to generate an output signal having a particular oscillation frequency based on the frequency of an input reference signal by locking the phase of the output signal with the phase of the input reference signal. However, as the frequency of the input reference signal increases (e.g., frequencies in the GHz range or higher), the latencies and/or response times of the analog circuitry impair the ability of the analog PLLs to effectively lock the output signal with the input reference signal. Digital PLLs, on the other hand, suffer from inherent jitter (idle jitter or dither jitter), and there is a tradeoff between the tracking bandwidth and the inherent jitter of the digital PLL.

BRIEF SUMMARY

In general, a digital phase-locked loop comprises an oscillator module configured to generate an output signal and a phase detection module coupled to the oscillator module. The phase detection module is configured to signal the oscillator module to adjust a frequency of the output signal by a first amount when a phase difference between a reference signal and the output signal is less than a first threshold amount, and signal the oscillator module to adjust the frequency by a greater amount when the phase difference is greater than the first threshold amount.

In one embodiment, an apparatus for a computing module is provided. The computing module comprises circuitry configured to communicate data over a serial interface and a digital phase-locked loop coupled to the circuitry. The digital phase-locked loop is configured to provide an output signal to the circuitry for synchronizing the data being communicated with the output signal. The digital phase-locked loop is configured to adjust a frequency of the output signal based on a phase difference between a reference signal and the output signal. The digital phase-locked loop adjusts the frequency of the output signal by a first amount when a phase difference between a reference signal and the output signal is less than a threshold amount, and adjusts the frequency of the output signal by a greater amount when the phase difference between the reference signal and the output signal is greater than the threshold amount.

In another embodiment, a method is provided for generating an output signal having a frequency using a digital phase-locked loop. The method comprises adjusting the frequency of the output signal by a first amount when a phase difference between the input signal and the output signal is less than a threshold amount, and adjusting the frequency of the output signal by a second amount when a phase difference between the input signal and the output signal is greater than the threshold amount, the second amount being greater than the first amount.

This summary is provided to introduce a selection of concepts in a simplified form that are further described in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Technologies and concepts discussed herein generally relate to digital phase-locked loops (PLLs) for generating an output signal in response to a relatively high frequency input reference signal (e.g., about 1 GHz or greater) that are also capable of achieving relatively high tracking bandwidth and relatively low inherent jitter. As used herein, a digital PLL should be understood as referring to a PLL that changes the frequency of the output signal by fixed amounts based on the relative phase differences between the output signal and the input reference signal. In this regard, the fixed amounts and the magnitude of the phase difference between the output signal and the input reference signal are not linearly related.

As described in greater detail below, an exemplary digital PLL includes phase detection circuitry that compares the phase of the input reference signal to the phase of the output signal and generates adjustment signals indicative of the phase difference between the input reference signal and the output signal. The adjustment signals are provided to oscillation circuitry that generates the output signal, and the adjustment signals are configured to adjust the frequency of the output signal. In this regard, when the magnitude of the phase difference between the input reference signal and the output signal is less than a threshold amount, the adjustment signals generated by the phase detection circuitry result in the oscillation circuitry adjusting the frequency of the output signal by a first fixed amount. When the phase difference between the input reference signal and the output signal is greater than the threshold amount, the adjustment signals generated by the phase detection circuitry result in the oscillation circuitry adjusting the frequency of the output signal by a second fixed amount that is greater than the first amount. In an exemplary embodiment, the fixed amounts are a percentage of the oscillation frequency for the oscillation circuitry. In some embodiments, the digital PLL is configured for multiple operating modes, allowing the digital PLL to be configured to adjust the frequency of the output signal at a reduced rate to achieve reduced inherent jitter (or idle jitter) if higher tracking bandwidth is not needed or desired.

Figure 1:
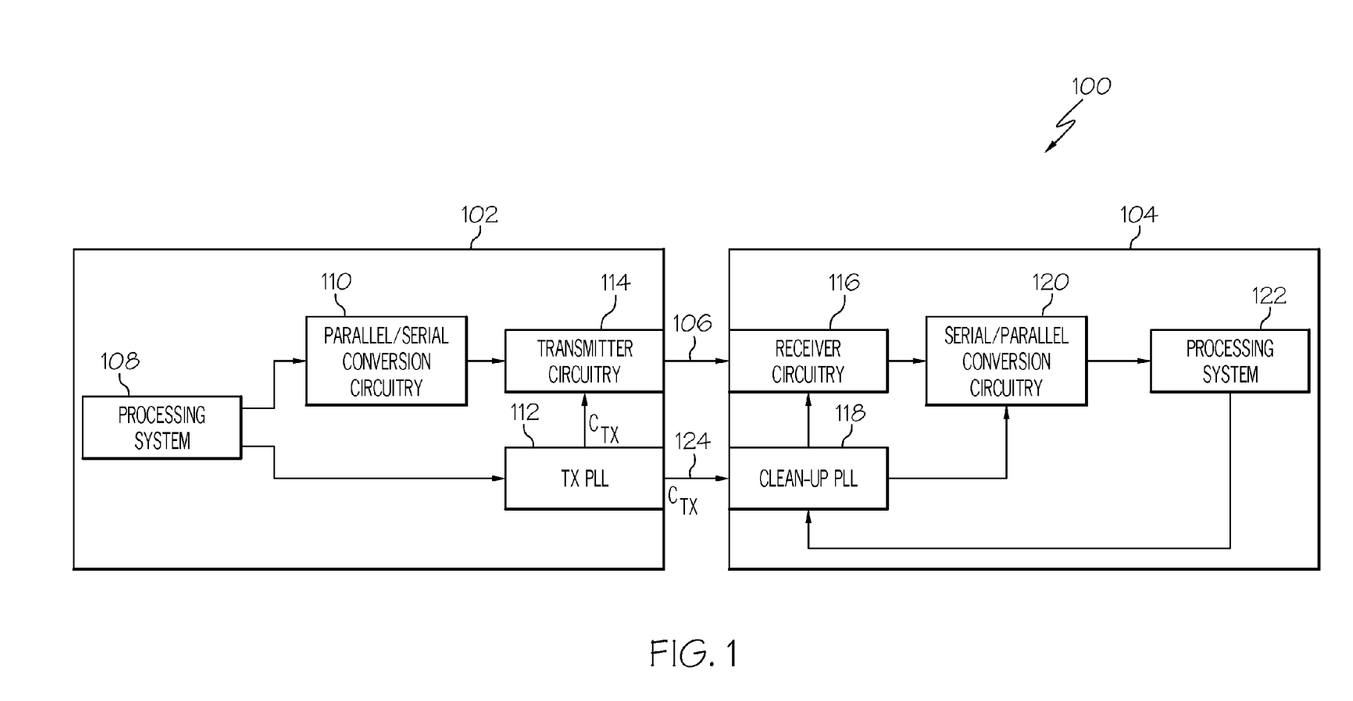
FIG. 1 is a block diagram of a system for communicating between two computing modules in accordance with one embodiment.

FIG. 1 depicts an exemplary embodiment of a system 100 for communicating data over a serial interface 106 from a first computing module 102, such as a processor, central processing unit (CPU), graphics processing unit (GPU), or the like, to a second computing module 104 (e.g., another processor, CPU, GPU, or the like). It should be understood that FIG. 1 is a simplified representation of a system 100 for purposes of explanation and ease of description, and FIG. 1 is not intended to limit the subject matter in any way. Practical embodiments may include other devices and components for providing additional functions and features, and/or the computing modules 102, 104 may be part of a larger system, as will be understood. In this regard, it should be understood that although the subject matter may be described in the context of communicating data from the first computing module 102 to the second computing module 104, the subject matter may be implemented in a like manner for communicating data from the second computing module 104 to the first computing module 102 or for communicating data to other modules not illustrated in FIG. 1, and in some embodiments, the serial interface 106 may be utilized for bidirectional communication between computing modules 102, 104. Furthermore, although FIG. 1 depicts the computing modules 102, 104 as distinct elements (e.g., separate chips and/or device packages), in some embodiments, the computing modules 102, 104 may be implemented as part of a common device package.

In an exemplary embodiment, the first computing module 102 includes, without limitation, a processing system 108, parallel-to-serial conversion circuitry 110, a transmit phase-locked loop (PLL) 112, and transmitter circuitry 114 configured to transmit or otherwise communicate data over the serial interface 106. The processing system 108 generally represents the main processing core for the first computing module 102. In various embodiments, the processing system 108 may be realized using one or more arithmetic logic units (ALUs), one or more floating point units (FPUs), one or more memory elements (e.g., one or more caches), discrete gate or transistor logic, discrete hardware components, or any combination thereof. The processing system 108 is coupled to the parallel-to-serial conversion circuitry 110 and generates or otherwise provides parallelized (or multi-bit) data to be transmitted to the second computing module 104, and provides the parallel data to the parallel-to-serial conversion circuitry 110. The parallel-to-serial conversion circuitry 110 is coupled between the processing system 108 and the transmitter circuitry 114, and the parallel-to-serial conversion circuitry 110 generally represents the hardware components that are configured to convert parallel data from the processing system 108 to serialized data capable of being transmitted or otherwise communicated over the serial interface 106. The processing system 108 is also coupled to the transmit PLL 112 and generates or otherwise provides a reference clock signal that is used as a reference signal by the transmit PLL 112 to generate an output signal for synchronizing the data being transmitted over the serial interface 106. In some embodiments, the reference clock signal may be provided by a component of the first computing module 102, such as a crystal oscillator or another local oscillator, as will be appreciated in the art.

In the illustrated embodiment, the transmit PLL 112 is coupled to the transmitter circuitry 114, and based on the reference clock signal received from the processing system 108, the transmit PLL 112 generates a transmit clock signal (or source-synchronous clock signal) that is used by the transmitter circuitry 114 to transmit data over the serial interface 106 in sync with the transmit clock signal ($C_{TX}$). In an exemplary embodiment, the frequency of the transmit clock signal ($C_{TX}$) is greater than 1 GHz, and is typically within the range of about 3 GHz to about 6 GHz, although higher frequencies may be utilized in some embodiments. In accordance with one or more embodiments, the transmit clock signal is a half-rate clock signal, that is, the frequency of the transmit clock signal is one half the frequency of the data rate for the serial data being transmitted over serial interface 106. The illustrated embodiment of FIG. 1 depicts a source-synchronous system, wherein the transmit PLL 112 is also coupled to a second serial interface 124 and configured to communicate the transmit clock signal ($C_{TX}$) over the second serial interface 124 to the second computing module 104 to support source-synchronous communications between computing modules 102, 104. The transmitter circuitry 114 generally represents the hardware components of the first computing module 102 that are configured to sequentially transmit individual bits of the serialized data from the output of parallel-to-serial conversion circuitry 110 over the serial interface 106 in sync with the transmit clock signal ($C_{TX}$) received from the transmit PLL 112.

In the illustrated embodiment, the second computing module 104 includes, without limitation, receiver circuitry 116 for receiving or otherwise communicating data over the serial interface 106, a clean-up PLL 118, serial-to-parallel conversion circuitry 120, and a second processing system 122. As illustrated in FIG. 1, the clean-up PLL 118 is coupled to the serial interface 124 and receives the transmit clock signal ($C_{TX}$) generated by the transmit PLL 112. In an exemplary embodiment, the clean-up PLL 118 is realized as a digital PLL that removes high frequency jitter and/or distortion from the signal received from the serial interface 124 before providing the cleaned-up clock signal to the receiver circuitry 116. As described in greater detail below, in an exemplary embodiment, the clean-up PLL 118 adjusts the frequency of the cleaned-up clock signal based on the phase difference between the cleaned-up clock signal and the transmit clock signal ($C_{TX}$) from the serial interface 124.

In an exemplary embodiment, the receiver circuitry 116 is coupled to the clean-up PLL 118 and generally represents the hardware components of the second computing module 104 that are coupled to the serial interface 106 and configured to convert electrical signals on the serial interface 106 to serialized digital values that are in sync with the cleaned-up clock signal received from the clean-up PLL 118. The serial-to-parallel conversion circuitry 120 is coupled to the output of the receiver circuitry 116 and the output of the clean-up PLL 118, and the serial-to-parallel conversion circuitry 120 generally represents the hardware components of the second computing module 104 that are configured to convert the serialized data from the receiver circuitry 116 that are synchronized with the transmit clock signal ($C_{TX}$) to parallel data that is synchronized with the clock domain of the processing system 122. The processing system 122 generally represents the main processing core for the second computing module 104, and the processing system 122 is coupled to the output of the serial-to-parallel conversion circuitry 120 and configured to receive and/or act upon the data from the serial-to-parallel conversion circuitry 120 in a conventional manner. Depending on the embodiment, the processing system 122 may be realized using one or more ALUs, one or more FPUs, one or more memory elements, discrete gate or transistor logic, discrete hardware components, or any combination thereof.

In the illustrated embodiment of FIG. 1, the processing system 122 is coupled to the clean-up PLL 118 and configured to control the clean-up PLL 118 to achieve a desired tradeoff between tracking bandwidth and inherent (or idle) jitter, as described in greater detail below in the context of FIG. 5. In this regard, in accordance with one or more embodiments, the clean-up PLL 118 is capable of operating in a first operating mode to provide relatively higher tracking bandwidth and operating in another mode to provide relatively lower inherent (or idle) jitter. The processing system 122 is configured to identify a desired operating mode for the digital-phase locked loop and automatically configure the digital phase-locked loop for the desired operating mode to achieve the desired amount of tracking bandwidth and/or jitter, as described in greater detail below.

Figure 2:
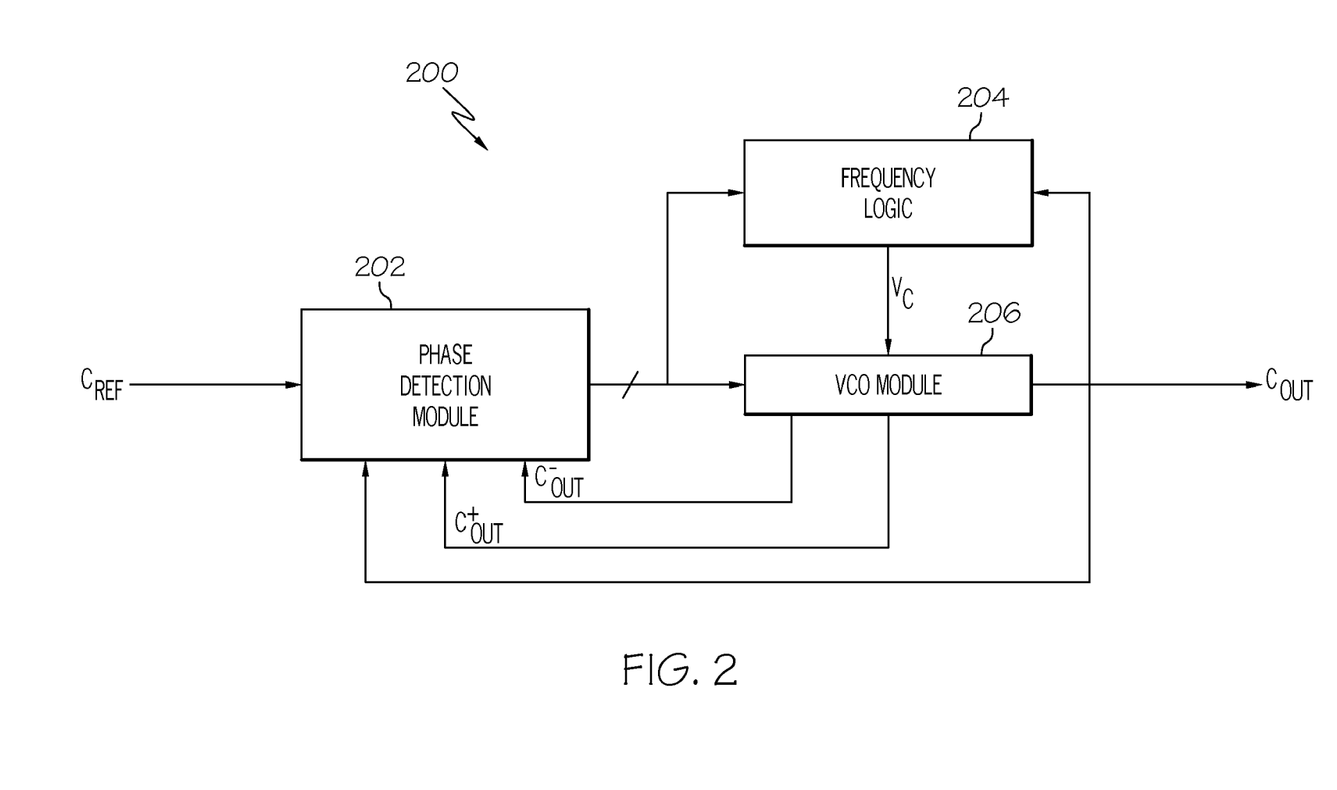
FIG. 2 is a block diagram of a digital phase-locked loop suitable for use in the system of FIG. 1 in accordance with one embodiment.

FIG. 2 depicts an exemplary embodiment of a digital PLL 200 suitable for use in the system 100 of FIG. 1. The illustrated embodiment of PLL 200 includes, without limitation, a phase detection module 202, frequency logic 204, and a voltage-controlled oscillator (VCO) module 206. The elements of the PLL 200 are suitably configured to produce an output signal ($C_{OUT}$) having a particular oscillation frequency in response to an input reference signal ($C_{REF}$), wherein the oscillation frequency is adjusted based on the phase difference between the input reference signal ($C_{REF}$) and the output signal ($C_{OUT}$), as described in greater detail below. In an exemplary embodiment, the digital PLL 200 is utilized as the clean-up PLL 118 in the second computing module 104 of FIG. 1, wherein the input reference signal ($C_{REF}$) corresponds to the transmit clock signal generated by the transmit PLL 112 and received from the first computing module 102 over the second serial interface 124, and the output signal ($C_{OUT}$) corresponds to the cleaned-up clock signal that is provided to the receiver circuitry 116 and/or serial-to-parallel conversion circuitry 120. However, in other embodiments, the input reference signal may be provided by a component of the second computing module 104, such as a crystal oscillator or another local oscillator, processing system 122, or another PLL. Although the subject matter may be described herein in the context of using the PLL 200 as a clean-up PLL (e.g., clean-up PLL 118) for source-synchronous communications, in other embodiments, the digital PLL 200 may be utilized for clock data recovery or other applications.

It should be understood that FIG. 2 is a simplified representation of the digital PLL 200 for purposes of explanation and ease of description, and FIG. 2 is not intended to limit the subject matter in any way. For example, although not illustrated by FIG. 2, practical employments may include frequency dividers and/or frequency multipliers in to scale the frequencies of the input reference signal ($C_{REF}$), output signal ($C_{OUT}$), and/or feedback signals ($C_{OUT}^+$, $D_{OUT}^-$) in a conventional manner before providing the input reference signal ($C_{REF}$), output signal ($C_{OUT}$), and/or feedback signals ($C_{OUT}^+$, $C_{OUT}^-$) to the phase detection module 202 and/or the frequency logic 204 to satisfy the needs of a particular implementation.

Figure 3:
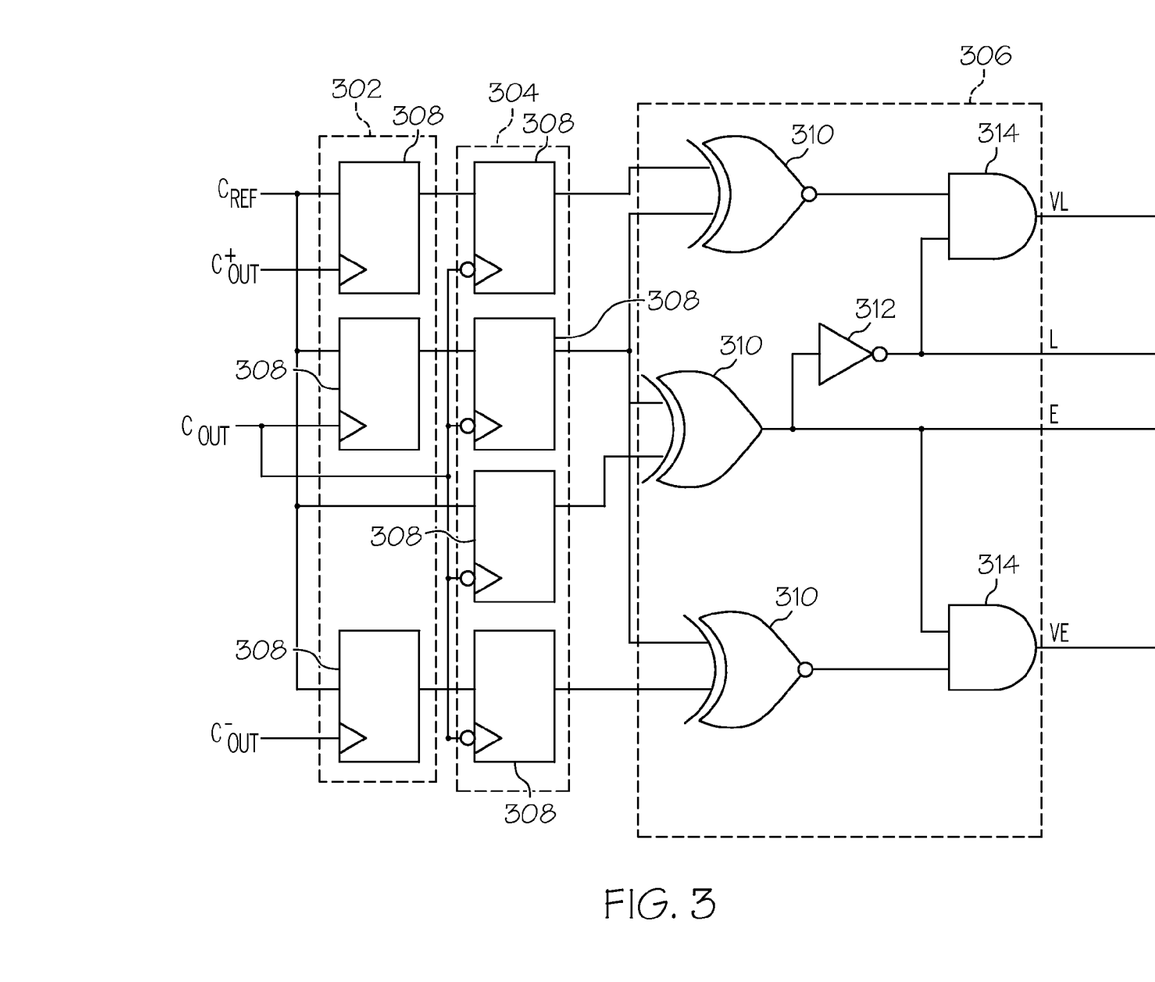
FIG. 3 is a schematic view of phase detection circuitry suitable for use in the digital phase-locked loop of FIG. 2 in accordance with one embodiment.

In an exemplary embodiment, the phase detection module 202 is coupled to the output of the VCO module 206, and the phase detection module 202 generally represents the hardware and/or other components configured to receive the input reference signal ($C_{REF}$) and feedback signals from the VCO module 206 and generate adjustment signals indicative of the phase difference between the input reference signal ($C_{REF}$) and the output signal ($C_{OUT}$) to produce a corresponding adjustment in the oscillation frequency of the output signal ($C_{OUT}$), as described in greater detail below in the context of FIG. 3. The frequency logic 204 is coupled to the output of the phase detection module 202 and the output of the VCO module 206, and the frequency logic 204 generally represents the hardware and/or other components configured to generate a control voltage ($V_C$) that calibrates or otherwise controls the oscillation frequency of the output signal ($C_{OUT}$) based on the output signal ($C_{OUT}$) received from the VCO module 206 and undersampled versions of the adjustment signals received from the phase detection module 202, as described in greater detail below. In an exemplary embodiment, the frequency logic 204 is configured to generate a control voltage ($V_C$) that ensures the oscillation frequency of the output signal ($C_{OUT}$) is maintained within about 2000 parts per million of the input reference signal (or within 0.2% of the frequency of the input reference signal). In this manner, the frequency logic 204 calibrates the PLL 200 for use with the input reference signal ($C_{REF}$).

The VCO module 206 generally represents the hardware and/or other components configured to generate the output signal ($C_{OUT}$) with an oscillation frequency based on the control voltage from the frequency logic 204. As described in greater detail below, the oscillation frequency of the output signal ($C_{OUT}$) is influenced by the adjustment signals from the phase detection module 202, such that the oscillation frequency of the output signal ($C_{OUT}$) is adjusted by a first amount when the phase difference between the input reference signal ($C_{REF}$) and the output signal ($C_{OUT}$) is less than a threshold amount, and by a greater amount when the phase difference between the input reference signal ($C_{REF}$) and the output signal ($C_{OUT}$) is greater than the threshold amount. The amounts by which the frequency of the output signal ($C_{OUT}$) is adjusted are fixed, that is, the amounts are independent of, and do not vary with respect to, the phase difference between the output signal ($C_{OUT}$) and the input reference signal ($C_{REF}$). As described above, the output signal ($C_{OUT}$) from the VCO module 206 is fed back to both the phase detection module 202 and the frequency logic 204 and functions as the main feedback signal for the PLL 200. In the illustrated embodiment, in addition to the output signal ($C_{OUT}$), the VCO module 206 is configured to generate a first feedback signal that corresponds to a leading (or time advanced) version of the output signal ($C_{OUT}^+$) and a second feedback signal that corresponds to a lagging (or time delayed) version of the output signal ($C_{OUT}^-$). For convenience, the leading version of the output signal ($C_{OUT}^+$) may alternatively be referred to herein as the leading feedback signal and the lagging version of the output signal ($C_{OUT}^-$) may alternatively be referred to herein as the lagging feedback signal.

As described in greater detail below in the context of FIG. 3, based on the input reference signal ($C_{REF}$) and feedback signals ($C_{OUT}$, $C_{OUT}^+$, $C_{OUT}^-$), the phase detection module 202 generates adjustment signals to increase/decrease the oscillation frequency of the output signal ($C_{OUT}$) by a first amount when the amount of the phase difference between the input reference signal ($C_{REF}$) and the output signal ($C_{OUT}$) is less than a threshold amount of phase difference. When the amount of the phase difference between the input reference signal ($C_{REF}$) and the output signal ($C_{OUT}$) is greater than the threshold amount, the phase detection circuitry generates adjustment signals to increase/decrease the oscillation frequency of the output signal ($C_{OUT}$) by a greater amount. As described in greater detail below, in an exemplary embodiment, the threshold amount corresponds to the phase difference between the output signal ($C_{OUT}$) and the respective leading/lagging feedback signal ($C_{OUT}^+$, $C_{OUT}^-$). The phase difference between the leading/lagging feedback signals ($C_{OUT}^+$, $C_{OUT}^-$) is a multiple of the period of the output signal ($C_{OUT}$), that is, the phase difference between the leading/lagging feedback signals and the output signal (e.g., the threshold amount) is dependent on the period (or the inverse of the frequency) of the output signal ($C_{OUT}$). For example, in accordance with one embodiment, the threshold amount is about one sixth the period of the full-rate clock, and thus, when the output signal ($C_{OUT}$) corresponds to a full-rate clock signal, the threshold amount is about one sixth the period of the full-rate clock ($C_{OUT}$). It should be appreciated that the threshold amount is not intended to be limited to any particular amount, and in practice, the threshold amount may be chosen to be another ratio of the period of the output signal (e.g., one third, one fourth, one twelfth) to satisfy the needs of a particular embodiment.

FIG. 3 depicts an exemplary embodiment of phase detection circuitry 300 suitable for use as the phase detection module 202 in the digital PLL 200 of FIG. 2. The illustrated embodiment of phase detection circuitry 300 includes, without limitation, a first array of latching elements 302, a second array of latching elements 304, and comparison logic 306. The arrays of latching elements 302, 304 and comparison logic 306 are cooperatively configured to generate adjustment signals (VL, L, E, VE) based on the phase difference between the input reference signal ($C_{REF}$) and feedback signals ($C_{OUT}$, $C_{OUT}^+$, $C_{OUT}^-$), as described in greater detail below.

Referring now to FIG. 3, with continued reference to FIG. 2, in an exemplary embodiment, when used as the phase detection module 202 in the PLL 200 of FIG. 2, the phase detection circuitry 300 generates a logical high value (or logical '1') for a first adjustment signal (L) when the phase of the output signal ($C_{OUT}$) lags the phase of the input reference signal ($C_{REF}$) by an amount less than a threshold amount (the phase difference between $C_{OUT}^+$ and $C_{OUT}$), and generates a logical high value for a second adjustment signal (VL) when the phase of the output signal ($C_{OUT}$) lags the phase of the input reference signal ($C_{REF}$) by an amount greater than the threshold amount. In this regard, the first adjustment signal (L) is indicative of the phase (or rising edge) of the output signal ($C_{OUT}$) occurring later in time than the phase (or rising edge) of the input reference signal ($C_{REF}$), and the second adjustment signal (VL) is indicative of the phase (or rising edge) of the output signal ($C_{OUT}$) occurring even later in time relative to the phase (or rising edge) of the input reference signal ($C_{REF}$). Accordingly, for convenience, but without limitation, the first adjustment signal (L) is alternatively referred to herein as the late adjustment signal and the second adjustment signal (VL) is alternatively referred to herein as the very late adjustment signal. The late adjustment signal (L) is configured to increase the oscillation frequency of an oscillator of the VCO module 206, and thereby increase the frequency of the output signal ($C_{OUT}$) by a predetermined amount, and the very late adjustment signal (VL) is configured to increase the oscillation frequency of the output signal ($C_{OUT}$) by an amount greater the amount of adjustment in response to the late adjustment signal (L).

Conversely, the phase detection circuitry 300 generates a logical high value for a third adjustment signal (E) when the phase of the output signal ($C_{OUT}$) leads the phase of the input reference signal ($C_{REF}$) by an amount less than a second threshold amount (the phase difference between $C_{OUT}^-$ and $C_{OUT}$), and generates a logical high value for a fourth adjustment signal (VE) when the phase of the output signal ($C_{OUT}$) leads the phase of the input reference signal ($C_{REF}$) by an amount greater than the second threshold amount. In this regard, the third adjustment signal (E) is indicative of the phase (or rising edge) of the output signal ($C_{OUT}$) occurring earlier in time than the phase (or rising edge) of the input reference signal ($C_{REF}$), and the second adjustment signal (VE) is indicative of the phase (or rising edge) of the output signal ($C_{OUT}$) occurring even earlier in time relative to the phase (or rising edge) of the input reference signal ($C_{REF}$). Accordingly, for convenience, but without limitation, the third adjustment signal (E) is alternatively referred to herein as the late adjustment signal and the fourth adjustment signal (VE) is alternatively referred to herein as the very early adjustment signal. The early adjustment signal (E) is configured to decrease the oscillation frequency of the output signal ($C_{OUT}$) by a predetermined amount, and the very early adjustment signal (VL) is configured to decrease the oscillation frequency of the output signal ($C_{OUT}$) by an amount greater the amount of adjustment in response to the early adjustment signal (E).

In the illustrated embodiment, the first array of latching elements 302 comprises a plurality of flip-flops 308 configured to sample the state of the input reference signal ($C_{REF}$) with respect to rising edges of the output signal ($C_{OUT}$) and feedback signals ($C_{OUT}^+$, $C_{OUT}^-$). The second array of latching elements 304 comprises a plurality of flip-flops 308 configured to sample the state of the outputs of the first array of latching elements 302 on the falling edges of the output signal ($C_{OUT}$) to bring the outputs of the first array of latching elements 302 to the same clock domain.

The comparison logic 306 is coupled to the outputs of the second array of latching elements 304 and comprises exclusive-or (XOR) logic gates 310, an inverter gate 312, and AND logic gates 314 suitably configured to generate logical values for the adjustment signals (VL, L, E, VE) based on the state of the outputs of the second array of latching elements 304. In this regard, when the phase of the output signal ($C_{OUT}$) lags the phase of the input reference signal ($C_{REF}$) but the phase of the leading feedback signal ($C_{OUT}^+$) does not lag the phase of the input reference signal ($C_{REF}$) (i.e., the phase difference between $C_{REF}$ and $C_{OUT}$ is less than the phase difference between $C_{OUT}^+$ and $C_{OUT}$), the comparison logic 306 and/or phase detection circuitry 300 generates a logical high value for the late adjustment signal (L) and logical low values (or logical '0') for the remaining adjustment signals (VL, E, VE). Similarly, when the phase of the output signal ($C_{OUT}$) lags the phase of the input reference signal ($C_{REF}$) and the phase of the leading feedback signal ($C_{OUT}^+$) lags the phase of the input reference signal ($C_{REF}$) (i.e., the phase difference between $C_{REF}$ and $C_{OUT}$ is greater than the phase difference between $C_{OUT}^+$ and $C_{OUT}$), the comparison logic 306 and/or phase detection circuitry 300 generates a logical high value for the very late adjustment signal (VL) and logical low values for the remaining adjustment signals (L, E, VE). Conversely, when the phase of the output signal ($C_{OUT}$) leads the phase of the input reference signal ($C_{REF}$) but the phase of the lagging feedback signal ($C_{OUT}^-$) does not lead the phase of the input reference signal ($C_{REF}$) (i.e., the phase difference between $C_{REF}$ and $C_{OUT}$ is less than the phase difference between $C_{OUT}^-$ and $C_{OUT}$), the comparison logic 306 and/or phase detection circuitry 300 generates a logical high value for the early adjustment signal (E) and logical low values for the remaining adjustment signals (VL, L, VE). When the phase of the output signal ($C_{OUT}$) leads the phase of the input reference signal ($C_{REF}$) and the phase of the lagging feedback signal ($C_{OUT}^-$) leads the phase of the input reference signal ($C_{REF}$) (i.e., the phase difference between $C_{REF}$ and $C_{OUT}$ is greater than the phase difference between $C_{OUT}^-$ and $C_{OUT}$), the comparison logic 306 and/or phase detection circuitry 300 generates a logical high value for the very early adjustment signal (VE) and logical low values for the remaining adjustment signals (VL, L, E).

It should be understood that FIG. 3 is a simplified representation of the phase detection circuitry 300 for purposes of explanation and ease of description, and FIG. 3 is not intended to limit the application or scope of the subject matter in any way. In this regard, although FIG. 3 depicts direct electrical connections between circuit elements and/or terminals, alternative embodiments may employ intervening circuit elements and/or components while functioning in a substantially similar manner.

Figure 4:
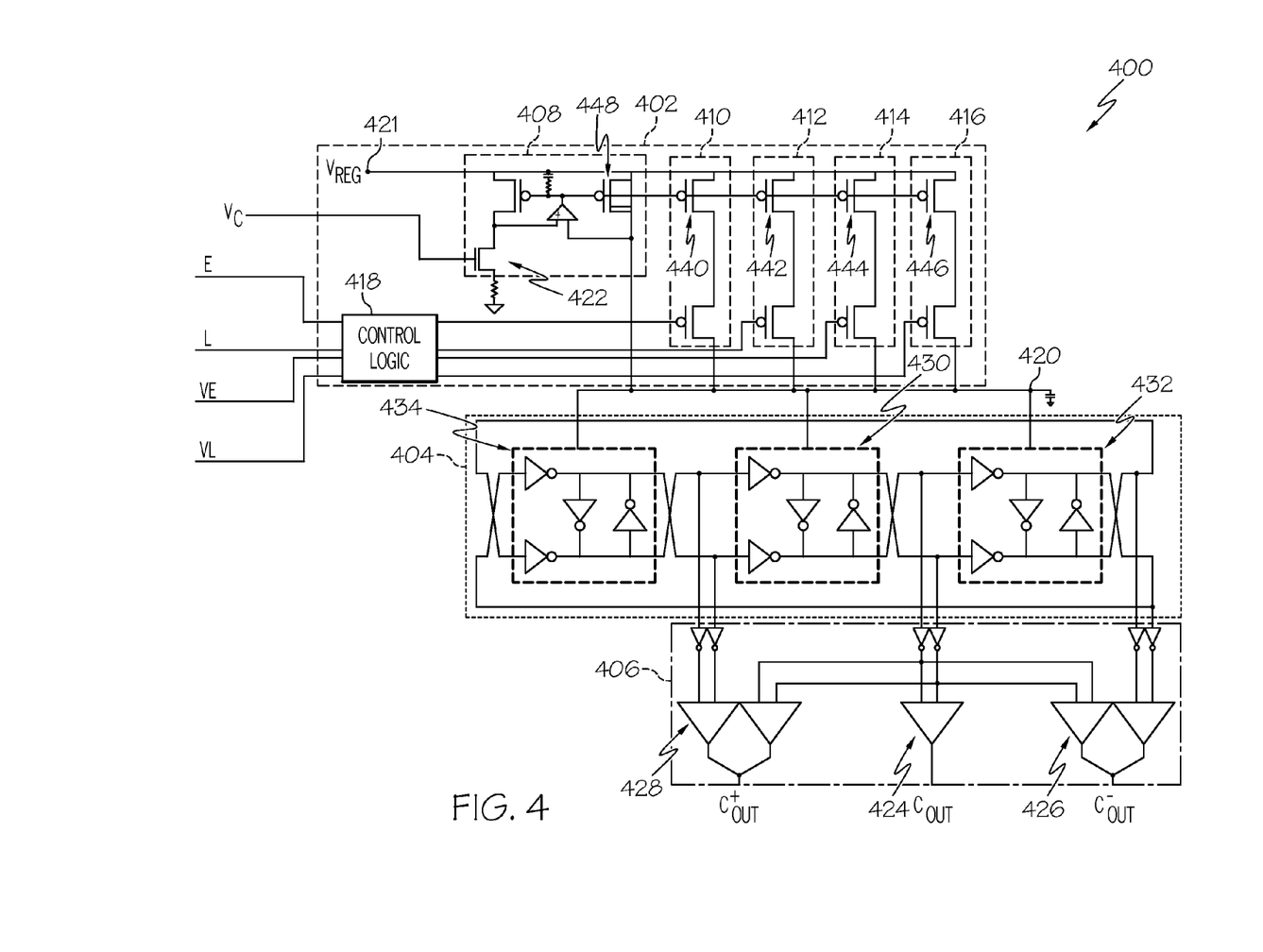
FIG. 4 is a schematic view of oscillator circuitry suitable for use in the digital phase-locked loop of FIG. 2 in accordance with one embodiment.

FIG. 4 depicts an exemplary embodiment of VCO circuitry 400 suitable for use as the VCO module 206 in the digital PLL 200 of FIG. 2. The illustrated embodiment of the VCO circuitry 400 includes, without limitation, voltage-to-current conversion circuitry 402, oscillator circuitry 404, and output generation circuitry 406. The voltage-to-current conversion circuitry 402 is coupled to the oscillator circuitry 404 and is configured to control a reference voltage for the oscillator circuitry 404 at node 420, which in turn, controls the oscillation frequency of the oscillator circuitry 404, as described in greater detail below. The output generation circuitry 406 generates an output signal ($C_{OUT}$) and additional feedback signals ($C_{OUT}^+$, $C_{OUT}^-$) based on the state of various stages of the oscillator circuitry 404.

The illustrated embodiment of voltage-to-current conversion circuitry 402 includes a first current mirror arrangement 408 coupled between a node 421 configured to receive a regulated or supply voltage ($V_{REG}$) and the oscillator circuitry 404 at node 420. A first transistor 422 of the current mirror arrangement 408 is configured to receive a control voltage ($V_C$) which turns on the transistor 422 and controls the reference current through transistor 422, and thereby controls the current flowing through the current mirror arrangement 408 to node 420, which, in turn, controls the oscillator reference voltage at node 420. In this manner, the current mirror arrangement 408 functions as the primary current mirror or reference current mirror for the voltage-to-current conversion circuitry 402. The voltage-to-current conversion circuitry 402 includes additional stacked transistor arrangements 410, 412, 414, 416 coupled between node 421 and node 420. Each stacked transistor arrangement 410, 412, 414, 416 is configured to mirror the reference current through transistor 422, or in other words, each stacked transistor arrangement 410, 412, 414, 416 functions as a secondary current mirror that may be enabled or otherwise turned on or off to increase or decrease the current flowing to node 420, and thereby control the voltage at node 420. In an exemplary embodiment, the voltage-to-current conversion circuitry 402 also includes control logic 418 configured to control which of the secondary current mirrors 410, 412, 414, 416 are concurrently turned on to set the voltage at node 420.

In an exemplary embodiment, the upper transistors 440, 442, 444, 446 of the secondary current mirrors 410, 412, 414, 416 are independently weighted and/or ratioed (or sized) with respect to the transistor 448 of the primary current mirror 408 to allow a respective secondary current mirrors 410, 412, 414, 416 to achieve a desired adjustment of the voltage at node 420. In this manner, the amount by which the voltage at node 420 is adjusted by current mirrors 410, 412, 414, 416 is process, voltage, and temperature (PVT) compensated because the amount of current through the current mirrors 410, 412, 414, 416 is controlled by transistor 448 of the primary current mirror 408, and since transistors 440, 442, 444, 446 are sized/weighted with respect to transistor 448, any PVT variations in transistor 448 and/or current mirror 408 are reflected by transistors 440, 442, 444, 446 and/or current mirrors 410, 412, 414, 416 in a corresponding manner. As a result, the fixed amount of frequency change produced by the VCO module 206, 400 in response to adjustment signals from the phase detection module 202, 300 to turn on/off one or more of the respective current mirrors 410, 412, 414, 416 is PVT compensated and may remain the same percentage of the oscillation frequency of the oscillator circuitry 404.

In the illustrated embodiment, the oscillator circuitry 404 is realized as a differential ring oscillator, wherein the frequency of the ring oscillator is controlled by the voltage at node 420. In this regard, the oscillation frequency of the oscillator circuitry 404 is directly related to the voltage at node 420, such that increasing the voltage at node 420 increases the oscillation frequency of the oscillator circuitry 404 and decreasing the voltage at node 420 decreases the oscillation frequency of the oscillator circuitry 404. The output generation circuitry 406 includes voltage level translation circuitry 424 configured to generate an output signal ($C_{OUT}$) based on the outputs of a stage 430 of the ring oscillator 404. The output generation circuitry 406 also includes voltage level translation and interpolation circuitry 426 configured to generate lagging version of output signal ($C_{OUT}^-$) based on the outputs of a stage 432 of the ring oscillator 404 that follows or lags the stage 430 used to generate the output signal ($C_{OUT}$). The voltage level translation and interpolation circuitry 426 generates the lagging feedback signal ($C_{OUT}^-$) by interpolating the outputs of stage 430 of the ring oscillator 404 and the outputs of stage 432 of the ring oscillator 404 after performing voltage level translation. Similarly, the output generation circuitry 406 also includes voltage level translation and interpolation circuitry 428 configured to generate leading version of output signal ($C_{OUT}^+$) by interpolating the outputs of stage 430 of the ring oscillator 404 and the outputs of a stage 434 of the ring oscillator 404 that precedes or leads the stage 430 used to generate the output signal ($C_{OUT}$) after performing voltage level translation. In one embodiment, the interpolation circuitry 426 is configured such that the lagging feedback signal ($C_{OUT}^-$) lags the output signal ($C_{OUT}$) by one sixth of the period of the output signal ($C_{OUT}$) and the interpolation circuitry 428 is configured such that the leading feedback signal ($C_{OUT}^+$) leads the output signal ($C_{OUT}$) by one sixth of the period of the output signal ($C_{OUT}$). In this manner, the phase differences between the leading/lagging feedback signals and the output signal (e.g., the threshold amount) are process, voltage, and temperature (PVT) compensated because any PVT variations in the oscillator circuitry 404 are reflected by the output signal and the leading/lagging feedback signals in a corresponding manner. In an exemplary embodiment, the interpolation circuitry 426, 428 is configurable to allow the phase difference between the leading/lagging versions of the output signal ($C_{OUT}$) to be adjusted. For example, the processing system 122 may be coupled to the interpolation circuitry 426, 428 and configured to adjust the interpolation circuitry 426, 428 to thereby adjust the ratio of the phase difference between the leading/lagging versions of the output signal to the clock period of the output signal.

It should be understood that FIG. 4 is a simplified representation of VCO circuitry 400 for purposes of explanation and ease of description, and FIG. 4 is not intended to limit the subject matter in any way. In this regard, in practice, the oscillator circuitry 404 may be realized using any suitable oscillator topology, and the subject matter is not intended to be limited to a particular type of oscillator structure being implemented by oscillator circuitry 404. Thus, although FIG. 4 depicts oscillator circuitry 404 having three stages, practical embodiments of the oscillator circuitry 404 may have any number of stages to satisfy the needs of a particular implementation. Additionally, although FIG. 4 depicts direct electrical connections between circuit elements and/or terminals, alternative embodiments may employ intervening circuit elements and/or components while functioning in a substantially similar manner.

Referring now to FIGS. 2-4, in an exemplary embodiment, when the VCO circuitry 400 is used in the PLL 200 of FIG. 2 as VCO module 206, transistor 422 of the primary current mirror 408 is configured to receive the control voltage ($V_C$) from the frequency logic 204 which sets the voltage at node 420 such that the oscillation frequency of the ring oscillator 404 is within a calibrated range of the frequency of the input reference signal ($C_{REF}$) (e.g., within 2000 parts per million), as described above. The outputs of the output generation circuitry 406 are coupled to or otherwise fed back to the inputs of the phase detection module 202. It should be noted that although not illustrated by FIG. 2, the outputs of the output generation circuitry 406 may be fed through frequency dividers before being fed to the phase detection module 202 in a conventional manner, as described above. The control logic 418 is coupled to the output of the phase detection module 202 and determines how many of the secondary current mirrors 410, 412, 414, 416 should be turned on to achieve a desired adjustment to the voltage at node 420 to produce a corresponding adjustment to the oscillation frequency of the ring oscillator 404.

In an exemplary embodiment, when the adjustment signals (VL, L, E, VE) are all logical low (e.g., during initial calibration of the PLL 200 and/or frequency logic 204 or when the output signal and the input reference signal are locked), the control logic 418 concurrently turns on two of the secondary current mirrors 410, 412 and turns off the remaining two secondary current mirrors 414, 416 to set the voltage at node 420. As described above, when the phase of the output signal ($C_{OUT}$) fed back to the phase detection module 202 lags the phase of the input reference signal ($C_{REF}$) but the phase of the leading feedback signal ($C_{OUT}^+$) does not lag the phase of the input reference signal ($C_{REF}$), the comparison logic 306 and/or phase detection circuitry 300 of the phase detection module 202 generates a logical high value for the late adjustment signal (L). In response to the logical high value for late adjustment signal (L) and logical low values for the remaining adjustment signals (VL, E, VE), the control logic 418 concurrently turns on three of the secondary current mirrors 410, 412, 414 while maintaining the remaining secondary current mirror 416 in an off state to increase the voltage at node 420, and thereby increases the frequency of the output signal by a first fixed amount (e.g., 1% of the oscillation frequency). As described above, the comparison logic 306 and/or phase detection circuitry 300 generates a logical high value for the very late adjustment signal (VL) when the phase of the leading feedback signal ($C_{OUT}^+$) lags the phase of the input reference signal ($C_{REF}$). In response to the logical high value for very late adjustment signal (VL) and logical low values for the remaining adjustment signals (L, E, VE), the control logic 418 concurrently turns on all four secondary current mirrors 410, 412, 414, 416 to further increase the voltage at node 420, and thereby increases the frequency of the output signal by a second fixed amount (e.g., 2% of the oscillation frequency).

Conversely, when the phase of the output signal ($C_{OUT}$) leads the phase of the input reference signal ($C_{REF}$) but the phase of the lagging feedback signal ($C_{OUT}^-$) does not lead the phase of the input reference signal ($C_{REF}$), the comparison logic 306 and/or phase detection circuitry 300 generates a logical high value for the early adjustment signal (E). In response to a logical high value for the early adjustment signal (E) and logical low values for the remaining adjustment signals (VL, L, VE), the control logic 418 turns on only one secondary current mirror 410 and turns off the remaining secondary current mirrors 412, 414, 416 to decrease the voltage at node 420, and thereby decreases the frequency of the output signal by a first fixed amount (e.g., 1% of the oscillation frequency). When the phase of the lagging feedback signal ($C_{OUT}^-$) leads the phase of the input reference signal ($C_{REF}$), the comparison logic 306 and/or phase detection circuitry 300 generates a logical high value for the very early adjustment signal (VE). In response to the logical high value for the very early adjustment signal (VE) and logical low values for the remaining adjustment signals (VL, L, E), the control logic 418 turns off all of the secondary current mirrors 410, 412, 414, 416 to further decrease the voltage at node 420, and thereby decreases the frequency of the output signal by a second fixed amount (e.g., 2% of the oscillation frequency). As described above, the transistors of the secondary current mirrors 410, 412, 414, 416 are sized (or ratioed) with respect to the transistors of the primary current mirror 408 and with respect to the transistors of the other secondary current mirrors 410, 412, 414, 416 to achieve desired amounts of adjustment to the voltage at node 420, and thereby, a desired fixed amount of adjustment to the oscillation frequency of the oscillator circuitry 404 as needed for a particular embodiment.

Figure 5:
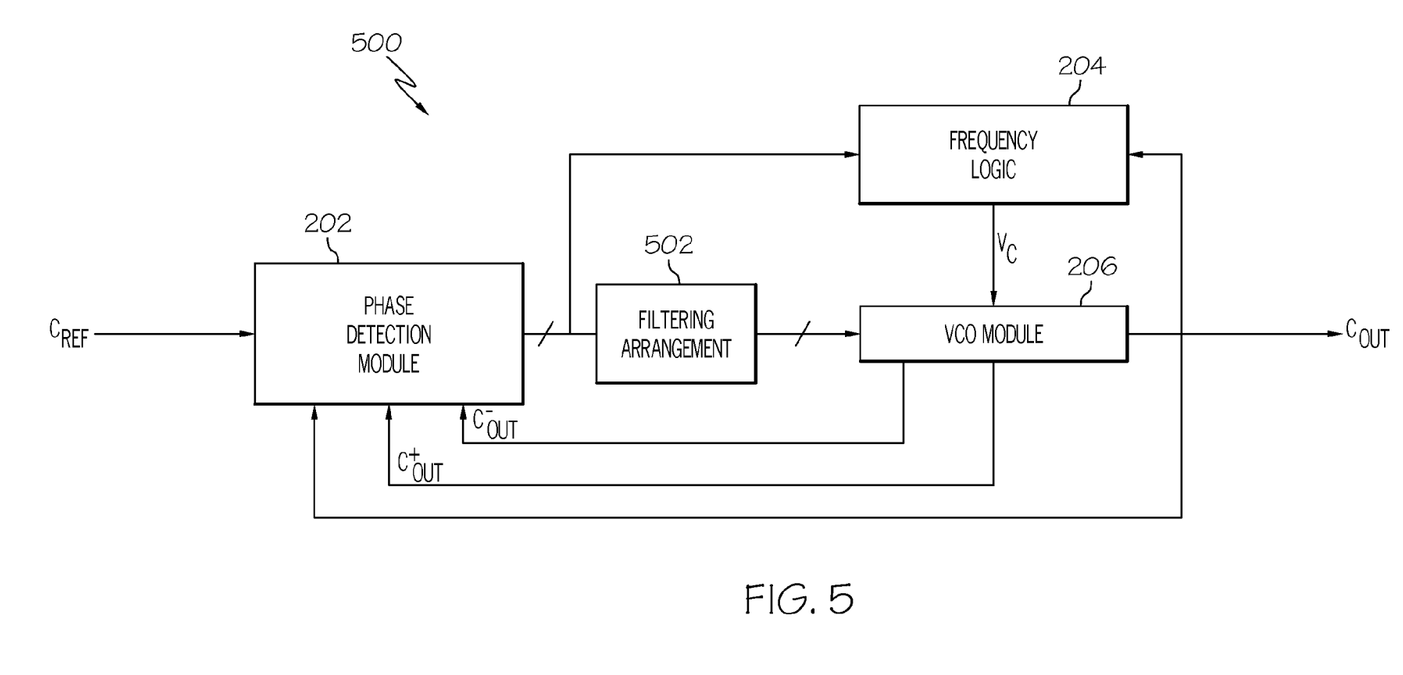
FIG. 5 is a block diagram of a digital phase-locked loop suitable for use in the system of FIG. 1 in accordance with another embodiment.

FIG. 5 depicts another embodiment of a digital PLL 500 suitable for use in the system 100 of FIG. 1. The elements of PLL 500 are similar to elements of PLL 200 described above, and such common elements will not be redundantly described here in the context of FIG. 5. The illustrated embodiment of PLL 500 includes a filtering arrangement 502 coupled between the output of the phase detection module 202 and the input to the VCO module 206. The filtering arrangement 502 generally represents the hardware and/or other components capable of selectively filtering the adjustment signals from the phase detection module 202 that are provided to the VCO module 206 to decrease the tracking bandwidth of the PLL 500 and reduce inherent (or idle) jitter. In this regard, when enabled, the filtering arrangement 502 provides the adjustment signals to the oscillator circuitry at the reduced rate relative to the rate at which the adjustment signals are generated by the phase detection module 202, and thereby reduces the rate at which the frequency of the output signal is adjusted and renders the PLL 500 less susceptible to jitter.

As described in greater detail below, in accordance with one or more embodiments, the filtering arrangement 502 and/or PLL 500 may be configured for either a tracking bandwidth mode or a jitter reduction mode. In the tracking bandwidth mode, the filtering arrangement 502 does not filter or otherwise modify the adjustment signals provided by the phase detection module 202 and allows the adjustment signals to pass through unmodified to the VCO module 206. In the jitter reduction mode, the filtering arrangement 502 filters the adjustment signals to reduce the frequency with which adjustment signals are provided to the VCO module 206.

In an exemplary embodiment, in the jitter reduction mode, the filtering arrangement 502 employs a counting scheme to determine whether to provide the adjustment signal to the VCO module 206. For example, the filtering arrangement 502 may require a predetermined number of adjustment signals before providing a corresponding adjustment signal to the VCO module 206. In this regard, the filtering arrangement 502 implements a counter that counts or otherwise tracks the adjustment signals being provided by the VCO module 206. For example, the filtering arrangement 502 may initialize (or reset) the counter to a particular value, and increment the counter by a first amount each time a late or very late adjustment signal (L or VL) is received and decrement the counter by the first amount each time an early or very early adjustment signal (E or VE) is received. In some embodiments, the very late and very early adjustment signals (VL, VE) may be weighted, such that the filtering arrangement 502 increments the counter by twice the first amount each time a very late adjustment signal (VL) is received and decrements the counter by twice the first amount each time a very early adjustment signal (VE) is received.

Referring now to FIGS. 1-5, in an exemplary embodiment, while the value of the counter does not exceed any upper threshold values or fall below any lower threshold values, the filtering arrangement 502 provides logical low values for the adjustment signals to the VCO module 206. As described above in the context of FIG. 4, in response to logical low values for all of the adjustment signals (VL, L, E, VE), control logic 418 of the VCO module 206 concurrently turns on two of secondary current mirrors 410, 412 of the voltage-to-current conversion circuitry 402 to set the voltage at node 420 and maintain the oscillation frequency of the oscillator circuitry 404 at its current frequency. When the value of the counter exceeds an upper threshold value, the filtering arrangement 502 may provide a logical high value for the late adjustment signal (L) to the control logic 418 to turn on three of the secondary current mirrors 410, 412, 414 to increase the voltage at node 420. Conversely, when the value of the counter falls below a lower threshold value, the filtering arrangement 502 may provide the early adjustment signal (E) to the control logic 418 to turn off three secondary current mirrors 412, 414, 416, leaving only one secondary current mirror 410 turned on, to decrease the voltage at node 420. In this manner, the digital PLL 500 is capable of adjusting the frequency of the output signal when the filtering arrangement 502 is enabled, but at a reduced rate relative to when filtering of the adjustment signals from the phase detection module 202 is disabled. In an exemplary embodiment, after providing an adjustment signal to the VCO module 206 and/or control logic 418 while in the jitter reduction mode, the filtering arrangement 502 resets the counter to its initial value. It will be appreciated that there are numerous possible counting and/or weighting schemes that may be used to achieve a desired amount of jitter reduction, and the operation of filtering arrangement 502 described herein is not intended to limit the subject matter in any way.

Referring now to FIGS. 1-5, in an exemplary embodiment, the filtering arrangement 502 is coupled to the processing system 122 and configured to allow the processing system 122 to control whether the PLL 500 is operated in the tracking bandwidth mode or the jitter reduction mode. In accordance with one embodiment, the processing system 122 determines the desired operating mode for the PLL 500 based on the data rate for the serial data communicated over serial interface 106. For example, if the data rate for the serial data is less than a threshold amount (e.g., data rate less than 1 GHz), the processing system 122 may identify the jitter reduction mode as the desired operating mode because the higher tracking bandwidth is not needed. However, if the data rate for the serial data is greater than the threshold amount (e.g., data rate greater than 1 GHz), the processing system 122 may identify the tracking bandwidth mode as the desired operating mode. In response to determining or otherwise identifying the data rate is greater than 1 GHz, the processing system 122 may identify the tracking bandwidth mode as the desired operating mode, and in response, provide one or more signals to the clean-up PLL 118 to disable or otherwise configure the filtering arrangement 502 pass unmodified adjustment signals from the phase detection module 202 to the VCO module 206. Conversely, in response to determining or otherwise identifying the data rate is less than 1 GHz, the processing system 122 may identify the jitter reduction mode as the desired operating mode, and in response, provide one or more signals to the clean-up PLL 118 to enable the filtering arrangement 502 to modify or otherwise filter the adjustment signals from the phase detection module 202 before providing adjustment signals to the VCO module 206 and/or control logic 418.

Figure 6:
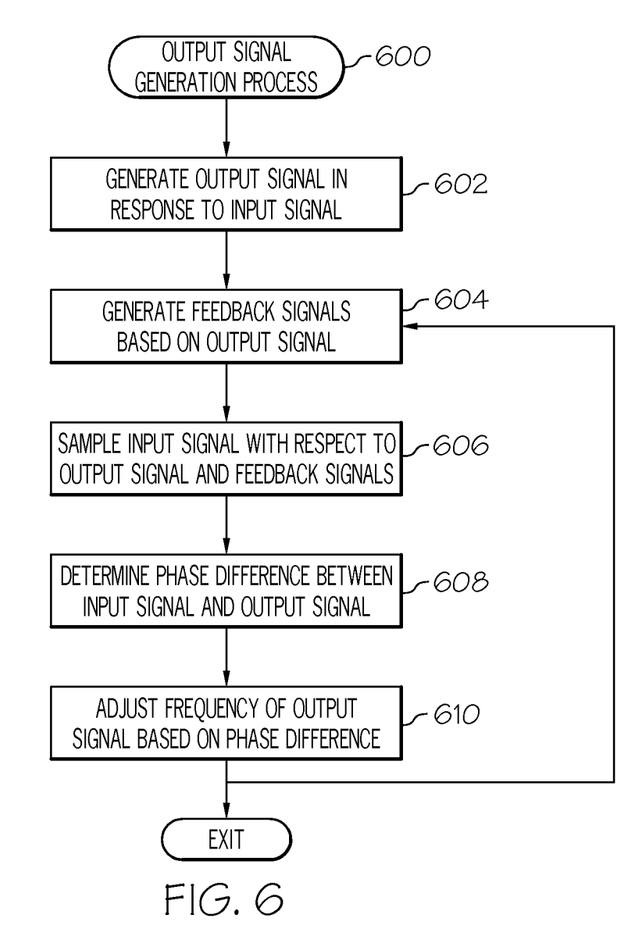
FIG. 6 is an output signal generation process suitable for use with the phase-locked loops of FIG. 2 or FIG. 5 in accordance with one or more embodiments.

FIG. 6 depicts an exemplary embodiment of an output signal generation process 600 that may be performed by the digital PLL 200 of FIG. 2 or the digital PLL 500 of FIG. 5. The various tasks may be performed by software, hardware, firmware, or any combination thereof. For illustrative purposes, the following description may refer to elements mentioned above in connection with FIGS. 1-5. In practice, the tasks, functions, and operations may be performed by different elements of the described system, such as the processing system 122, the phase detection module 202, 300 the frequency logic 204, the VCO module 206, 400, the voltage-to-current conversion circuitry 402, the oscillator circuitry 404, the output generation circuitry 406, and/or the control logic 418. It should be appreciated that any number of additional or alternative tasks may be included, and may be incorporated into a more comprehensive procedure or process having additional functionality not described in detail herein.

Referring now to FIG. 6, and with continued reference to FIGS. 1-6, the output signal generation process 600 begins by generating an output signal in response to an input reference signal (task 602). As described above, in an exemplary embodiment, the control voltage ($V_C$) from the frequency logic 204 is configured such that the frequency of the output signal is within a predetermined range of the frequency of the input reference signal. The output signal generation process 600 continues by generating one or more lagging and/or leading feedback signals based on the output signal (task 604). For example, as described above, the VCO module 206 may include output generation circuitry 406 that generates the lagging and/or leading feedback signals ($C_{OUT}^+$, $C_{OUT}^-$) by interpolating the output signal ($C_{OUT}$) with the output of a stage of an oscillator that precedes and/or follows the stage of the oscillator used to generate the output signal. The output signal generation process 600 continues by sampling the input reference signal with respect to the output signal and the feedback signals and determining the phase difference between the input reference signal and the output signal (task 606). For example, as described above, the phase detection circuitry 300 samples the input reference signal ($C_{REF}$) with respect to the feedback signals ($C_{OUT}^+$, $C_{OUT}^-$) and output signal ($C_{OUT}$) and determines whether the output reference signal lags and/or leads the input reference signal by greater than and/or less than a threshold amount. After determining the phase difference between the input reference signal and the output reference signal, the output signal generation process 600 continues by adjusting the frequency of the output signal based upon the phase difference (task 610). In this regard, as described above, the PLL 200, 500 increases the frequency of the output signal by a first amount (e.g., 1%) when the phase of the output signal lags the phase of the input reference signal by less than the threshold amount, and increases the frequency of the output signal by a greater amount (e.g., 2%) when the phase of the output signal lags the phase of the input signal by more than the threshold amount. Conversely, the PLL 200, 500 decreases the frequency of the output signal by the first amount (e.g., 1%) when the phase of the output signal leads the phase of the input reference signal by less than the threshold amount, and decreases the frequency of the output signal by a greater amount (e.g., 2%) when the phase of the output signal leads the phase of the input reference signal by more than the threshold amount. The loop defined by tasks 604, 606, 608, 610 may repeat throughout operation of the PLL 200, 500 to keep the phase of the output signal locked to the phase of input reference signal.

For the sake of brevity, conventional techniques related to phase-locked loops, electronic oscillators, circuit design, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used in the following description for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although the figures may depict one exemplary arrangement of elements, additional intervening elements, devices, features, or components may be present in an embodiment of the depicted subject matter. As used herein, a "node" means any internal or external reference point, connection point, junction, signal line, conductive element, or the like, at which a given signal, logic level, voltage, data pattern, current, or quantity is present.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient and edifying road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A digital phase-locked loop comprising:
   an oscillator module configured to generate a first signal; and
   a phase detection module coupled to the oscillator module, wherein the phase detection module is configured to:
      signal the oscillator module to adjust a frequency of the first signal by a first amount when a phase difference between a reference signal and the first signal is less than a threshold amount; and
      signal the oscillator module to adjust the frequency by a second amount when the phase difference is greater than the threshold amount, the second amount being greater than the first amount, wherein the first amount and the second amount are independent of the phase difference between the reference signal and the first signal.

2. The digital phase-locked loop of claim 1, wherein the first amount, the second amount, and the threshold amount are each dependent on the frequency of the first signal.

3. A digital phase-locked loop comprising:
   an oscillator module configured to generate a first signal; and
   a phase detection module coupled to the oscillator module, wherein the phase detection module is configured to:
      signal the oscillator module to adjust a frequency of the first signal by a first amount when a phase difference between a reference signal and the first signal is less than a threshold amount; and
      signal the oscillator module to adjust the frequency by a second amount when the phase difference is greater than the threshold amount, the second amount being greater than the first amount, wherein the phase detection module comprises:
         one or more latching elements configured to sample a phase of the reference signal with respect to a phase of the first signal; and
         comparison logic coupled to the one or more latching elements and the oscillator module, the comparison logic being configured to generate an adjustment signal based on a difference between the phase of the reference signal and the phase of the first signal, wherein the oscillator module is configured to adjust the frequency in response to the adjustment signal.

4. The digital phase-locked loop of claim 3, wherein:
   the comparison logic is configured to:
      generate a first adjustment signal in response to the difference between the phase of the reference signal and the phase of the first signal being less than the threshold amount; and
      generate a second adjustment signal in response to the difference between the phase of the reference signal and the phase of the first signal being greater than the threshold amount; and
   the oscillator module is configured to:
      adjust the frequency of the first signal by the first amount in response to the first adjustment signal; and
      adjust the frequency of the first signal by the second amount in response to the second adjustment signal.

5. A digital phase-locked loop comprising:
   an oscillator module is configured to generate a first signal and a second signal; and
   a phase detection module coupled to the oscillator module, wherein the phase detection module is configured to:
      signal the oscillator module to adjust a frequency of the first signal by a first amount when a phase difference between a reference signal and the first signal is less than a threshold amount by generating a first adjustment signal when the phase difference between the reference signal and the first signal is less than a phase difference between the first signal and the second signal, the oscillator module being configured to adjust the frequency of the first signal by the first amount in response to the first adjustment signal; and signal the oscillator module to adjust the frequency by a second amount when the phase difference is greater than the threshold amount by generating a second adjustment signal when the phase difference between the reference signal and the first signal is greater than the phase difference between the first signal and the second signal, the oscillator module being configured to adjust the frequency of the first signal by the second amount in response to the second adjustment signal, the second amount being greater than the first amount.

6. The digital phase-locked loop of claim 5, wherein:
the second signal is a leading version of the first signal; and
the oscillator module is configured to:
increase the frequency of the first signal by the first amount in response to the first adjustment signal; and
increase the frequency of the first signal by the second amount in response to the second adjustment signal.

7. The digital phase-locked loop of claim 6, wherein the oscillator module comprises:
oscillator circuitry configured to oscillate at the frequency in response to a voltage at a first node; and
voltage-to-current conversion circuitry including a plurality of current mirrors coupled to the first node, each current mirror of the plurality of current mirrors being configured to increase the voltage at the first node when turned on, wherein the voltage-to-current conversion circuitry is configured to:
turn on a first current mirror of the plurality of current mirrors and turn off a second current mirror if the plurality of current mirrors in response to the first adjustment signal, resulting in the frequency being increased by the first amount; and
turn on the first current mirror and the second current mirror concurrently in response to the second adjustment signal, resulting in the frequency being increased by the second amount.

8. The digital phase-locked loop of claim 5, wherein:
the second signal is a lagging version of the first signal; and
the oscillator module is configured to:
decrease the frequency of the first signal by the first amount in response to the first adjustment signal; and
decrease the frequency of the first signal by the second amount in response to the second adjustment signal.

9. The digital phase-locked loop of claim 8, wherein the oscillator module comprises:
oscillator circuitry configured to oscillate at the frequency in response to a voltage at a first node; and
voltage-to-current conversion circuitry including a plurality of current mirrors coupled to the first node, each current mirror of the plurality of current mirrors being configured to increase the voltage at the first node when turned on, wherein the voltage-to-current conversion circuitry is configured to:
turn off a first current mirror of the plurality of current mirrors in response to the first adjustment signal, resulting in the frequency being decreased by the first amount; and
turn off the first current mirror and a second current mirror of the plurality of current mirrors concurrently in response to the second adjustment signal, resulting in the frequency being decreased by the second amount.

10. A computing module comprising:
circuitry configured to communicate data over a serial interface; and
a digital phase-locked loop coupled to the circuitry, the digital phase-locked loop being configured to provide an output signal to the circuitry for communicating the data in sync with the output signal, wherein the digital phase-locked loop is configured to:
adjust a frequency of the output signal by a first amount when a phase difference between a reference signal and the output signal is less than a threshold amount; and
adjust a frequency of the output signal by a second amount when a phase difference between the reference signal and the output signal is greater than the threshold amount, the second amount being greater than the first amount, wherein the first amount and the second amount are independent of the phase difference between the reference signal and the output signal.

11. The computing module of claim 10, wherein the digital phase-locked loop is configured to:
increase/decrease the frequency of the output signal by the first amount when a magnitude of the phase difference between the reference signal and the output signal is less than the threshold amount; and
increase/decrease the frequency of the output signal by the second amount when the magnitude of the phase difference between the reference signal and the output signal is greater than the threshold amount.

12. A computing module comprising:
receiver circuitry configured to receive data from a serial interface; and
a digital phase-locked loop coupled to the circuitry, the digital phase-locked loop being configured to provide an output signal to the receiver circuitry for receiving the data in sync with the output signal, wherein the digital phase-locked loop is configured to:
a reference signal from a second serial interface;
adjust a frequency of the output signal by a first amount when a phase difference between the reference signal and the output signal is less than a threshold amount; and
adjust a frequency of the output signal by a second amount when a phase difference between the reference signal and the output signal is greater than the threshold amount, the second amount being greater than the first amount.

13. The computing module of claim 12, wherein the reference signal comprises a transmit clock signal provided by a second computing module transmitting the data over the serial interface.

14. A computing module comprising:
circuitry configured to communicate data over a serial interface; and
a digital phase-locked loop coupled to the circuitry, the digital phase-locked loop being configured to provide an output signal to the circuitry for communicating the data in sync with the output signal, wherein the digital phase-locked loop is configured to:
adjust a frequency of the output signal by a first amount when a phase difference between a reference signal and the output signal is less than a threshold amount; and adjust a frequency of the output signal by a second amount when a phase difference between the reference signal and the output signal is greater than the threshold amount, the second amount being greater than the first amount, wherein the digital phase-locked loop is configured to:
  adjust the frequency of the output signal at a first rate in a first operating mode; and
  adjust the frequency of the output signal at a reduced rate relative to the first rate in a second operating mode.

15. The computing module of claim 14, further comprising a processing system coupled to the digital phase-locked loop, wherein the processing system is configured to:
  identify a desired operating mode for the digital phase-locked loop;
  configure the digital phase-locked loop for the first operating mode in response to identifying the first operating mode as the desired operating mode; and
  configure the digital phase-locked loop for the second operating mode in response to identifying the second operating mode as the desired operating mode.

16. The computing module of claim 14, wherein:
  the digital phase-locked loop includes:
    phase detection circuitry configured to generate adjustment signals based on the phase difference between the reference signal and the output signal at the first rate;
    oscillator circuitry configured to adjust the frequency of the output signal in response to the adjustment signals; and
    a filtering arrangement coupled between the phase detection circuitry and the oscillator circuitry, the filtering arrangement being configured to provide the adjustment signals to the oscillator circuitry at the reduced rate; and
  the processing system is configured to:
    disable the filtering arrangement in response to identifying the first operating mode as the desired operating mode; and
    enable the filtering arrangement in response to identifying the second operating mode as the desired operating mode.

17. A method for generating an output signal having a frequency using a digital phase-locked loop, the method comprising:
  adjusting, by the digital phase-locked loop, the frequency of the output signal by a first amount when a phase difference between an input signal and the output signal is less than a threshold amount;
  adjusting, by the digital phase-locked loop, the frequency of the output signal by a second amount when a phase difference between the input signal and the output signal is greater than the threshold amount, the second amount being greater than the first amount; and
  generating a lagging feedback signal based on the output signal, wherein:
    adjusting the frequency of the output signal by the first amount comprises increasing/decreasing the frequency of the output signal by the first amount when the phase difference between the input signal and the output signal is less than a phase difference between the output signal and the lagging feedback signal; and
    adjusting the frequency of the output signal by the second amount comprises increasing/decreasing the frequency of the output signal by the second amount when the phase difference between the input signal and the output signal is greater than the phase difference between the output signal and the lagging feedback signal.

18. A method for generating an output signal having a frequency using a digital phase-locked loop, the method comprising:
  generating a feedback signal based on the output signal;
  adjusting, by the digital phase-locked loop, the frequency of the output signal by a first amount when a phase difference between an input signal and the output signal is less than a phase difference between the output signal and the feedback signal; and
  adjusting, by the digital phase-locked loop, the frequency of the output signal by a second amount when a phase difference between the input signal and the output signal is greater than the phase difference between the output signal and the feedback signal, the second amount being greater than the first amount.

19. The method of claim 18, further comprising sampling the input signal with respect to the output signal and the feedback signal to determine the phase difference between the input signal and the output signal.

20. The method of claim 18, the feedback signal comprising a leading feedback signal, wherein:
  adjusting the frequency of the output signal by the first amount comprises increasing/decreasing the frequency of the output signal by the first amount when the phase difference between the input signal and the output signal is less than a phase difference between the output signal and the leading feedback signal; and
  adjusting the frequency of the output signal by the second amount comprises increasing/decreasing the frequency of the output signal by the second amount when the phase difference between the input signal and the output signal is greater than the phase difference between the output signal and the leading feedback signal.

* * * * *